United States Patent [19]

Swiatosz

[11] 4,253,515
[45] Mar. 3, 1981

[54] INTEGRATED CIRCUIT TEMPERATURE GRADIENT AND MOISTURE REGULATOR

[75] Inventor: Edmund Swiatosz, Maitland, Fla.

[73] Assignee: United States of America as represented by the Secretary of the Navy, Washington, D.C.

[21] Appl. No.: 947,280

[22] Filed: Sep. 29, 1978

[51] Int. Cl.³ .................. F25B 29/00; F28F 27/00; H01L 23/02; H02B 1/00
[52] U.S. Cl. .................. 165/61; 165/80 A; 357/81; 361/381
[58] Field of Search .............. 165/32, 61, 80 A, 80 B, 165/80 D; 357/81, 82, 83; 361/381

[56] References Cited

U.S. PATENT DOCUMENTS

| | | | |
|---|---|---|---|
| 3,178,895 | 4/1965 | Mole et al. | 165/80 A |
| 3,412,566 | 11/1968 | Townsend et al. | 165/80 B |
| 3,800,190 | 3/1974 | Marek | 357/82 |
| 4,034,469 | 7/1977 | Koopman et al. | 29/628 |
| 4,037,270 | 7/1977 | Ahmann et al. | 357/79 |
| 4,051,509 | 9/1977 | Beriger et al. | |

Primary Examiner—Alfred E. Smith
Assistant Examiner—Janice A. Howell
Attorney, Agent, or Firm—Richard S. Sciascia; Robert W. Adams

[57] ABSTRACT

An improved temperature gradient and moisture regulator for electrically powered apparatus and the like is disclosed as comprising an insulated mount for supporting the apparatus whose temperature gradient and moisture is to be controlled. A thermoelectric cooler is located in effective contact with both a certain substantially central surface area of said apparatus where the cooling thereof is to be effected and one end area of an elongated heat pipe. A plurality of thermoelectric heaters is also disposed in contact with such surface areas of said apparatus as are located in predetermined spatial proximity with the aforesaid cool surface area, thereby creating a heating effect thereat for moisture control purposes. Both predetermined cooled and heated areas are caused to occur at various surface locations where the temperature gradients thereof are to be controlled. Several other cooling sources may optionally be connected to the other end area of the aforesaid heat pipe, either individually or in concert, so as to increase the cooling efficiency of the invention.

27 Claims, 2 Drawing Figures

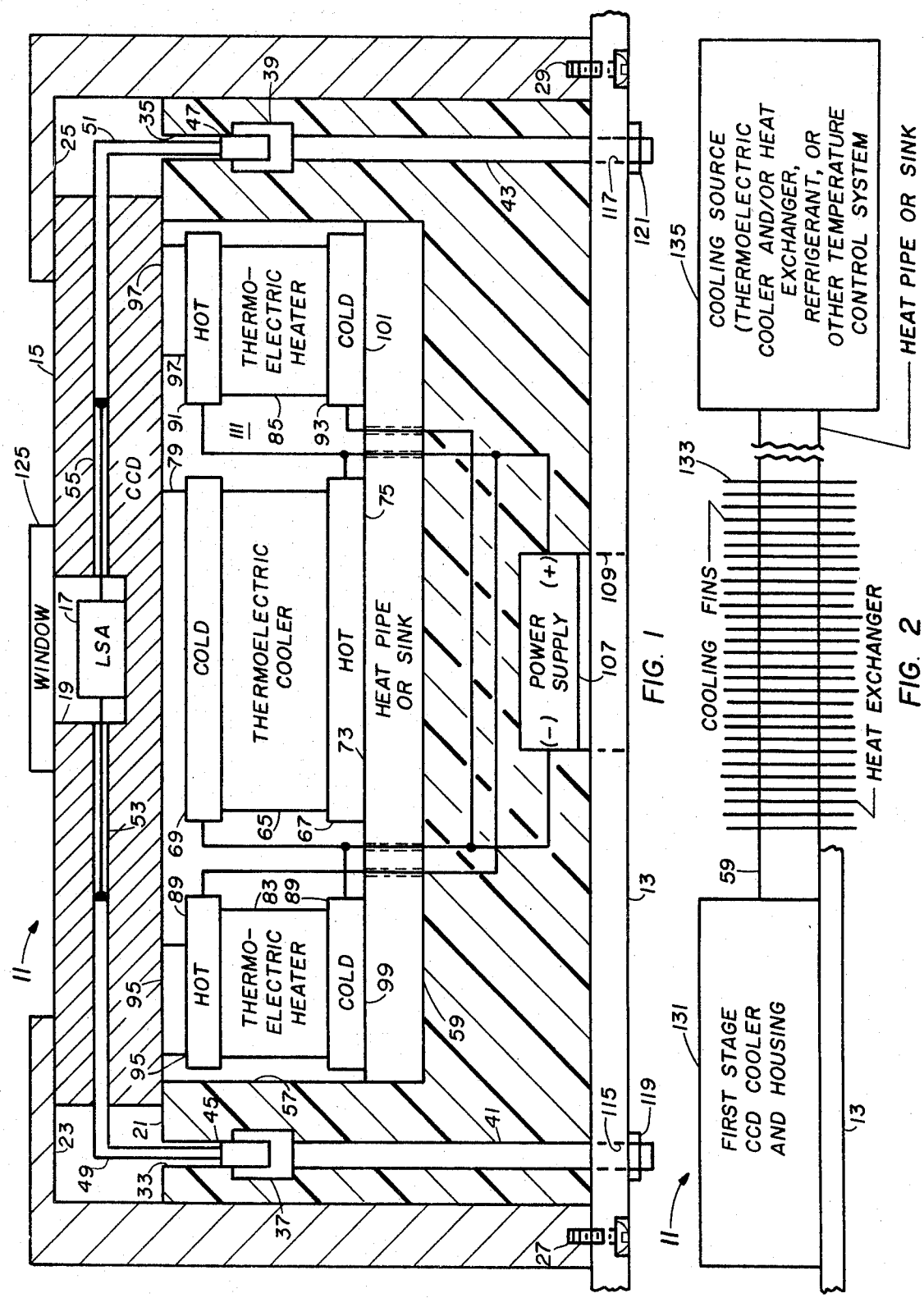

INTEGRATED CIRCUIT TEMPERATURE GRADIENT AND MOISTURE REGULATOR

FIELD OF THE INVENTION

In general, the present invention relates to cooling and heating systems, and, in particular, it pertains to a combination cooling-heating system for semi-conductors, integrated circuits, and other devices, either prepackaged or not. In even greater particularity, the subject invention comprises an improved method and means for controlling the temperature and moisture condensate of a charge coupled device (CCD).

DESCRIPTION OF THE PRIOR ART

Because the dissipation of heat from physical objects, electrical circuits, and especially from such devices as semiconductor chips, integrated circuits, and charge coupled devices has been a problem for both industry and the scientific community, numerous types of cooling systems have been devised for controlling the temperature thereof, both from the standpoints of internal design and by regulating the ambient temperature. Such cooling systems are actually too numerous to discuss with real significance; however, it might be well to mention that they seem to run the gamut from simple insulative packaging to elaborate refrigeration systems.

In addition to the above, various and sundry thermal conduction type cooling systems have been invented, as represented by those covered by the following mentioned and discussed patents:

1. U.S. Pat. No. 3,800,190 to Alois Marek for Cooling System for Power Semiconductor Devices, issued Mar. 26, 1974. In the invention covered by this patent, cooling is facilitated in a power semiconductor arrangement by means of thin surface contact layers which, on one side, are in area contact with the current conducting surfaces of a semiconductor body and, on the opposite side, in heat transfer contact with a coolant and in electrical contact with the main terminals. The coolant may be circulated, for example, by the coaction of gravity and convection, or by so-called heat pipe techniques. The contact layers are relatively thin, as previously mentioned, and are made of materials having good electrical and thermal conductivity. Preferably, the main terminals contact said surface contact layers above the semiconductor regions where the smaller part of dissipation energy originates, and the coolant contacts said surface contact layers where the main part of dissipation energy originates during the current conducting state of the semiconductor element.

2. U.S. Pat. No. 4,034,469 to Nicholas George Koopman and Paul Anthony Totta for Method of Making Conduction-Cooled Circuit Package, issued July 12, 1977. The invention covered by this patent includes a circuit package exhibiting a heat transfer path from a semiconductor chip or other heat-generating device to a heat-sink type can or package cover. A heat conducting pad is metallurgically bonded to either said cover or a surface of said heat-generating device, and a heat conducting pad separably attached but metallurgically unbonded to the other. Deformable metal is separately attached to a major surface of the chip to be cooled, so that there is no stress between the chip (or any of its joints) and any attachment solder when the chip generates heat during the electrical operation thereof. The preferred method of fabrication involves the mechanical deforming of a mass of solder against the back side of the chip after the solder has been metallurgically bonded to a heat-sink. This process may be accomplished at either high or low temperatures, depending upon the solid composition and the relative strength of the leads which join the chip to conductive supportive substrate.

3. U.S. Pat. No. 4,037,270 to Gerald L. Ahmann et al for Circuit Packaging and Cooling, issued July 19, 1977. The invention covered by this patent includes a circuit board having a plurality of groups of connectors, so disposed and arranged with respect to each other in such manner that each group thereof is capable of receiving a chip carrier. A fluid conduit, carrying a coolant, extends through each group, so that when the contacts of the chip carrier are assembled as a group of connectors, any circuit chip having a heat dissipating bar that is carried thereby is in contact with said conduit. Conductors on each chip make electrical contacts with the contacts on the chip carrier. A clip fastener is fastened to the carrier and includes means to bias the chip mounted thereon, so that electrical connections are established between the chip contacts and the carrier contacts, and thermal connection is established between the heat dissipating bar and the aforesaid conduit.

4. U.S. Pat. No. 4,051,509 to Conrad Beriger et al for Apparatus for Cooling Electrical Devices at Different Electrical Potentials by Means of a Flowing Medium, issued Sept. 27, 1977. The invention covered by this patent includes an apparatus for cooling electrical devices which are at different electrical potentials by means of water or other flowing fluid medium.

SUMMARY OF THE INVENTION

Although the aforesaid prior art devices undoubtedly work quite well for their respective intended purposes, they appear to leave something to be desired from the efficiency and utility standpoints. Accordingly, the subject invention ostensively constitutes an advancement in the state of the art.

Briefly, the instant invention includes several stages of cooling—each of which could be considered as constituting cooling and/or heating subsystems—effectively combined in a heat transfer series arrangement. The first stage thereof withdraws heat that was generated by the device to be cooled and conducts it to a predetermined heat exchanger and/or a refrigerator or other cooling source, all of which may be closely or remotely disposed with respect to one another.

Although only the regulation of temperature is involved, the present invention, in actuality, regulates a temperature gradient within the device to be cooled in such manner that the higher temperature of said temperature gradient effects the control of moisture thereon, while the lower temperature thereof actually controls the temperature of the area required to be cooled, vis, the light sensitive area (LSA) in the case where the said device is, say, a charge coupled device (CCD).

The coldest temperature of said temperature gradient is effected by a miniature thermoelectric cooler having a cold junction, a hot junction, and a thermopile therebetween, with the cold junction thereof being in thermal contact with the device to be cooled in that area where the integrated circuitry—say, the aforementioned light sensitive area—is located, and with the hot junction thereof being in thermal contact with a metallic, but preferably copper, heat pipe (or heat-sink). Adjacent to but spatially disposed a predetermined distance from said miniature thermoelectric cooler is a plurality (a pair in this embodiment) of miniature thermoelectric heaters that are, in and of themselves, similar to the aforesaid miniature thermoelectric cooler, but which are reversed, as far as heat flow therethrough is concerned. To effect such reversal of heat flow, and thereby heat predetermined areas of the device to be cooled for moisture control purposes, the aforesaid plurality of thermoelectric heaters have their hot junctions in thermal contact with certain areas thereof and their cold junctions in thermal contact with certain areas of the aforesaid heat pipe. Hence, a temperature gradient exists between those surface areas of the device to be cooled that are located between the cold and hot junctions of said adjacently disposed thermoelectric heaters and cooler. Therefore, as suggested above, performance of a charge coupled device, solid state circuit, integrated circuit, transistor, or any other appropriate device, may be enhanced considerably, contingent upon whatever design limits would be effected by such parameters as size, materials, ambient environment, other apparatus associated therewith, intended use, and the like.

Therefore, an object of paramount importance of this invention is to provide an improved charge coupled device temperature gradient regulator.

Another object of this invention is to provide an improved method and means for selectively controlling both the temperature and destructive surface moisture of integrated circuitry, semiconductor chips, charge coupled devices, and any and all other apparatus compatible therewith.

Still another object of this invention is to provide an improved method and means for packaging charge coupled and other electronic devices in an exceedingly useful manner.

Another object of this invention is to provide an improved method and means for reducing the inherent noise of solid state electronic components.

A further object of this invention is to provide a relatively compact cooling and/or heating system for electronic and other devices, thereby increasing the useful life thereof.

Another object of this invention is to provide an improved method and means for increasing the operational performance, accuracies, signal-to-noise ratios, and the like of charge coupled devices, semiconductors, silicon chips, transistors, and other solid state devices.

Another object of this invention is to provide a method and means for effecting the heating, cooling, temperature gradient controlling, and moisture controlling of charge coupled and other powered devices with improved heat transfer efficiencies.

BRIEF DESCRIPTION OF THE DRAWING

FIG. 1 illustrates a somewhat detailed elevational view, partly in cross-section, partly in schematic form, and partly in block diagram form, of a charge coupled device cooler-heater subsystem and an encasement therefor; and FIG. 2 depicts a side elevational view of the total system, including the subsystem of FIG. 1, constituting the subject invention.

DESCRIPTION OF THE PREFERRED EMBODIMENT

Referring now to FIG. 1, there is shown a charge coupled device cooler and housing portion 11 of the invention as being mounted on any suitable printed circuit board 13. Incorporated therein is charge coupled device (CCD) 15 having a light sensitive element (LSE) 17 mounted in a conventional manner in a predetermined slot 19 therein. It may, for example, be an integrated circuit, photo-sensitive semiconductor, Fairchild CCD-131 type charge coupled device, if so desired.

Charge coupled device (CCD) 15 preferably has a base made of aluminum oxide; however, it may be made of any material suitable for its intended purpose. It is, in turn, mounted in such manner on the open end of an elongated, cup-shaped insulator 21, the latter of which is preferably made of an epoxy or other plastic electrically and thermally insulative type material. CCD 15 is also clamped in place on insulator 21 by a pair of L-shaped clamps 23 and 25 that are effectively connected to the aforesaid printed circuit board 13, as by screws 27 and 29, or any other convenient, conventional means.

Said cup-shaped insulator 21 contains a pair of holes 33 and 35 therethrough, in which are disposed a pair of electrical sockets 37 and 39, to the ends of which a pair of prongs 41 and 43 are electrically connected, respectively. Said holes, sockets, and prongs may be placed within cup-shaped insulator 21 during the manufacture thereof if so desired, thereby permanently containing and retaining them therein. In the alternative, said holes, sockets, and prongs may be sized such that they would be compatible with associated structure and removable, as warranted by operational circumstances. Obviously, it would be well within the purview of the artisan having the benefit of the teachings presented herewith to select and size holes 33 and 35, sockets 37 and 39, and prongs 41 and 43, so as to facilitate their optimum manufacture and assembly.

A pair of electrical plugs 45 and 47 are slidably and removably inserted in electrical sockets 37 and 39 in such manner that firm physical and electrical contacts are made therebetween, respectively; and connected between said plugs 45 and 47 are a pair of electrically conductive strips 49 and 51 which are held in position within CCD 15 in a mechanically fixed manner, but with the ends thereof that are opposite the ends connected to prongs 41 and 43 being respectively connected to the terminals of light sensitive apparatus 17 by means of a pair of electrical wires 53 and 55.

Because, as previously mentioned, insulator 21 is cup-shaped, it has a relatively large slot 57 extending along at least part of the length thereof (the ends thereof may be insulated, too, but are not shown), and seated in the bottom thereof (as shown in the attitude of FIG. 1) is a heat-pipe 59 that may be made of any suitable heat conductive material—such as, copper, aluminum, or any other metal—but which, in this particular case, is preferably made of copper, since it is a good, readily available, economical, thermal conductor.

A thermoelectric cooler 65 having a hot junction 67 and a cold junction 69 is mounted in contact with the aforesaid heat pipe 59 in such manner that hot junction 67 is in thermal contact with a predetermined (in this case, substantially centrally located) portion of the upper surface 73 thereof. To provide optimum heat transfer efficiency between the contacting surfaces of said hot junction 67 and surface 73, a metallurgical thermal bonding 75 of any type appropriate to the contacting surface thereof may be employed.

Thermoelectric cooler 65 is, in actuality, a rather sophisticated thermocouple or thermopile; therefore, it inherently includes said hot and cold junctions 67 and 69 therein. Nevertheless, since it is one of the key components of the instant invention, it has been found that the temperature difference between said hot and cold junctions can be optimized in this particular case by using the thermoelectric device known as Model MI-1022, manufactured by Marlo Industries, Inc., of Garland, Tex. Accordingly, although any suitable thermocouple or thermopile may be used as thermoelectric cooler 65 due to their inherent hot and cold junction characteristics, it has been found that the pre-manufactured version thereof manufactured by the above mentioned Marlo Industries, Inc., works very well.

Disposed between cold junction 69 of thermoelectric cooler 65 and a predetermined bottom surface of CCD 15 is a thermal conductive gasket 79, the latter of which is preferably made of some suitable metal, but may be made of any desired material, such as, for instance, a thermally conductive grease, or the like.

Adjacent to but spatially disposed a predetermined distance from the aforesaid thermoelectric cooler 65 is a pair of thermoelectric heaters 83 and 85, the former of which has a hot junction 87 and a cold junction 89, and the latter of which has a hot junction 91 and a cold junction 93. A pair of metallic (or other suitable material) heat-conducting gaskets 95 and 97 are respectively disposed between the under aluminum oxide surface of charge coupled device 15 and hot junctions 87 and 91 of thermoelectric heaters 83 and 85. Of course, as may readily be seen, cold junctions 89 and 93 thereof are disposed in effective thermal contact with the aforesaid heat pipe 59 and are held in place thereat, say, as by any suitable metallic bonding materials, such as solder 99 and 101, or the like. Obviously, the relative spacing between thermoelectric cooler 65 and thermoelectric heaters 83 and 85 determines the thermal gradients therebetween. Accordingly, it should be understood that their relative dispositions and numbers may be such as will provide cooling and heating at any desired locations for temperature and/or moisture control purposes.

For electrical energization purposes, the aforementioned thermoelectric cooler 65 and the aforesaid thermoelectric heaters 83 and 85 all have their hot and cold junctions respectively interconnected electrically, and connected to the positive and negative terminals of any appropriate direct current voltage (DCV) power supply 107, such as, for instance, a battery or the equivalent.

If so desired, and without limitation, the volume of slot 57 surrounding and not occupied by thermoelectric cooler 65, thermoelectric heaters 83 and 85, and gaskets 79, 95, and 97 may be filled with any suitable epoxy, silicone, or other potting material 111 that would make the subject invention rugged, shock resistant, etc., and thus, would facilitate its being used within a hostile ambient environmental medium including but not limited to water, outer space, the earth's atmosphere, or any other predetermined place.

Since the aforementioned printed circuit board 13 may be of any conventional type, the aforesaid prongs 41 and 43 may respectively extend through holes 115 and 117 and slidably or otherwise be connected to appropriate electrical conductors or lugs 119 and 121 conventionally mounted on the underside thereof.

Furthermore, as is ordinarily conventional in the charge coupled device packaging art, a glass or plastic window 125 may be used to cover the aforesaid light sensitive apparatus 17, and for such purpose, it is preferably sealed or bonded to charge coupled device 15 by means of any suitable adhesive 127.

It would perhaps be noteworthy at this time that the respective junctions and physical or mechanical contacts of all of the components of this invention may be sealed or metallurgically bonded to each other, respectively, in whatever manner will optimize it for its intended use, without violating the spirit or scope thereof.

Of course, that portion or stage of the invention shown in FIG. 1 may be disposed in any properly designed container or housing 131 (see FIG. 2) that will protect it from its ambient environment or that will facilitate its being mounted as desired.

Referring again to FIG. 2, the above discussed CCD cooler and housing are depicted as being in conjunction with another important cooling apparatus that acts in cooperation therewith, in order to optimize the cooling and/or temperature control thereof. As may readily be seen therein, heat pipe 59 extends out of charge coupled device cooler 11 and housing 131, and, thus, it may be as short or as long as necessitated by apparatus conductions and operational circumstances. To the extent said heat pipe 59 is exposed to the ambient environment, it may optionally be insulated along any predetermined portions thereof by any suitable conventional thermal insulation material that would be adequate for its particular disposition and length.

Attached to heat pipe 59—as by metallurgical bonding, welding, or the like, is a plurality of metallic cooling fins 133, and connected to the other extremity of heat pipe 59 is another cooling source 135, which may include a thermoelectric cooler, a thermoelectric cooler-heat exchanger combination, a heat exchanger alone, a refrigerator, or any other temperature control subsystem, the selection of which would obviously be well within the purview of the artisan having the benefit of the teachings presented herein and an awareness of the particular use to which the invention is to be put. Of course, fins 133 and/or cooling source 135 may, likewise, be optional, depending upon operational circumstances and ambient environment.

Although discussed more fully subsequently during the explanation of the operation of the subject invention, it would appear to be significant that in the above mentioned embodiment of the invention the primary intent is to effect the proper and desired cooling of charge coupled device 15. Thus, thermoelectric cooler 65 and thermoelectric heaters 83 and 85 were disposed with their respective hot and cold junctions as shown. However, the reverse situation is possible, too, and if it is desired to heat charge coupled device 15, said thermoelectric cooler and heater junctions may be reversed for such purpose. Accordingly, suffice to say at this time, that the present invention may be constructed to be a charge coupled device temperature or temperature gradient controller, regardless of whether the ambient environment thereof is too hot—as, for example, in powered electrical or electronic equipment—or too cold—as, for example, in arctic regions, outer space, and other cold climate conditions, be they natural or artificial. In any event, whether said thermoelectric coolers are constructed and assembled in combination with the apparatus associated therewith as coolers or heaters, they, in conjunction with the remainder of the elements combined therewith constitute a new combination of elements that produces new and improved operational results, the likes of which will now be discussed more fully below.

MODE OF OPERATION

The operation of the invention will now be discussed briefly in conjunction with both figures of the drawing.

When a charge coupled or other device to be cooled 10 is mounted as illustrated in FIG. 1, it becomes cooled in the lower substantially central portion thereof, due to the fact that, when electrically energized, the temperature of cold junction 69 of thermoelectric cooler 65 becomes quite a bit colder than hot junction 67 thereof. Consequently, heat is withdrawn from CCD 15 in the general area that is in proximity with light sensitive apparatus 17 (or any other device that may be substituted therefor), while light sensitive area 17 is being exposed to whatever light (or other radiant energy as the case may be) is passing through window 125.

The heat withdrawn from CCD 15 is conducted through thermal conductive gasket 79 and the cold junction, thermopile, and hot junction of thermoelectric cooler 65 when the invention has been designed for and has been used in the cooling mode. Then, heat pipe 59, being in thermal conductive contact with hot junction 67 via metallurgical bonding 75, absorbs a considerable amount of heat therefrom and, in turn, conducts it out of housing 131 toward cooling fins 133 and/or cooling source 135, which facilitates the dissipation thereof to the atmosphere (or other ambient environmental medium as the case may be). If so desired, an air or other blower (not shown) may be employed to carry away as much heat as possible from fins 133 and/or cooling source 135, thereby tending to optimize the cooling efficiencies thereof. Thus, from the foregoing, it may readily be seen that the heat path comprising light sensitive area 17, CCD 15, heat conductive gasket 79, thermoelectric cooler 65, metallurgical bonding 75, heat pipe 59, cooling fins 133, and/or cooling source 135 causes the transfer of heat from light sensitive area 17 to some place else in a highly efficient manner, thereby causing the operation of CCD 15 to be vastly improved in most instances. Of course, the reverse would be true and heat would travel along said path in the direction opposite that mentioned above if the respective junctions of thermoelectric cooler 65 and thermoelectric heaters 83 and 85 were reversed. Obviously, in such case, however, CCD 15 would then be heated rather than cooled, as previously suggested. Again, when in the cooling mode, at the same time, thermoelectric heaters 83 and 85 would be effectively pumping some heat from heat pipe 59 back to certain areas of the underside of CCD 15, thereby causing predetermined temperature gradients to occur between the locations in contact with gasket 79 and gaskets 95 and 97.

In the event heat pipe 59 has to pass through an environment that is hotter than CCD 15, it may be thermally isolated therefrom by means of any good conventional heat insulation, as previously suggested. Hence, if heat pipe 59 would have to pass in proximity with other powered heat-producing equipment (be it electrical, electronic, or otherwise) in order to reach fins 133 or cooling source 135, the addition of the aforesaid optional thermal insulation would probably improve the heat transfer characteristics thereof. Furthermore, being effectively isolated from its ambient environment—except for the light sensitive or other operative area or surface of light sensitive area 17—by insulator 21, circuit board 13, clamps 23 and 35, and perhaps epoxy, silicone, or other potting material (the latter of which is, likewise, optional), the cooling of said CCD 15 is also improved thereby.

In any event, because heat is removed from CCD 15 in a highly efficient manner, CCD 15 performs its function in a more efficient and desirable manner, even though it may range in size from exceedingly small to very large. Therefore, the performance of any device, apparatus, or equipment within which it is a component will operate better, too.

Obviously, many modifications and variations of the present invention are possible in light of the above teachings. It is, therefore, to be understood that within the scope of the appended claims the invention may be practiced otherwise than as specifically described.

What is claimed is:

1. An apparatus temperature and moisture regulator, comprising in combination:
    an apparatus whose temperature and moisture is to be regulated;
    means effectively connected to said apparatus for the effective packaging thereof in such manner as to effect the support thereof and thermally isolate it from its ambient environment;
    a heat pipe extending through one of the walls of said packaging means;
    a thermoelectric cooler means having a hot junction and a cold junction, with the hot junction thereof effectively thermally connected to said heat pipe, and with the cold junction thereof effectively thermally connected to a predetermined area of said apparatus whose temperature and moisture is to be regulated; and
    a thermoelectric heater means having a hot junction and a cold junction, with the hot junction thereof effectively thermally connected to a predetermined area of said apparatus whose temperature and moisture is to be regulated that is located a predetermined distance from the cold junction of the aforesaid thermoelectric cooler means, and with the cold junction thereof effectively thermally connected to said heat pipe.

2. The device of claim 1, wherein said apparatus whose temperature and moisture is to be regulated comprises a charge coupled device.

3. The device of claim 1, wherein said apparatus whose temperature and moisture is to be regulated comprises a solid state electronic circuit.

4. The device of claim 1, wherein said apparatus whose temperature and moisture is to be regulated comprises a mechanical device.

5. The device of claim 1, wherein said apparatus whose temperature and moisture is to be regulated comprises a transistor.

6. The device of claim 1, wherein said apparatus whose temperature and moisture is to be regulated is an electrical apparatus.

7. The device of claim 1, wherein said apparatus whose temperature and moisture is to be regulated is a solid state, electronic apparatus.

8. The device of claim 1, wherein said means effectively connected to said apparatus for the effective packaging thereof in such manner as to effect the support thereof and thermally isolate it from its ambient environment comprises:

a cup-shaped insulator having a plurality of substantially parallel walls and a wall interconnecting said parallel walls at one of the ends of each thereof, with the other ends of said substantially parallel walls having surfaces upon which said apparatus is mounted;

a printed circuit board disposed in contact with one of the surfaces of the aforesaid interconnecting wall of the aforesaid cup-shaped insulator; and a pair of clamps connected to said printed circuit board and a predetermined surface of said apparatus in such manner as to hold said apparatus against a portion of the end surfaces of the respective other ends of the substantially parallel walls of said cup-shaped insulator.

9. The device of claim 1, wherein said heat pipe is a metallic hollow pipe capable of containing a refrigerant type of fluid that is disposed in effective contact with and between a surface of the hot junction of said thermoelectric cooler and an inside surface of said packaging means.

10. The device of claim 1, wherein said thermoelectric cooler means comprises a thermocouple.

11. The device of claim 1, wherein said thermoelectric cooler means comprises a thermopile.

12. The device of claim 1, wherein said thermoelectric heater means comprises a thermocouple.

13. The device of claim 1, wherein said thermoelectric heater means comprises a thermopile.

14. The invention of claim 1, further characterized by means connected to the end of said heat pipe that is opposite the end thereof that extends through the wall of said packaging means for conducting heat therefrom.

15. The device of claim 14, wherein said means connected to the end of said heat pipe that is opposite the end thereof that extends through the wall of said packaging means for conducting heat therefrom comprises a plurality of cooling fins.

16. The device of claim 14, wherein said means connected to the end of said heat pipe that is opposite the end thereof that extends through the wall of said packaging means for conducting heat therefrom comprises a refrigerant source.

17. The device of claim 14, wherein said means connected to the end of said heat pipe that is opposite the end thereof that extends through the wall of said packaging means for conducting heat therefrom comprises a temperature control system.

18. The device of claim 14, wherein said means connected to the end of said heat pipe that is opposite the end thereof that extends through the wall of said packaging means for conducting heat therefrom comprises a thermoelectric cooler having a cold junction, a hot junction, and a thermopile therebetween, with the cold junction thereof effectively thermally connected to said heat pipe.

19. The device of claim 14, wherein said means connected to the end of said heat pipe that is opposite the end thereof that extends through the wall of said packaging means for conducting heat therefrom comprises:

a thermoelectric cooler having a cold junction, a hot junction, and a thermopile therebetween, with the cold junction thereof effectively thermally connected to said heat pipe; and a heat exchanger thermally connected to the hot junction of said thermoelectric cooler.

20. A charge coupled device temperature gradient and moisture regulator, comprising in combination:

a substantially cup-shaped insulator having a predetermined space therewithin;

a charge coupled device mounted on the open end of said substantially cup-shaped insulator;

an elongated heat pipe disposed in contact with an inside surface of said substantially cup-shaped insulator and extending through one of the walls thereof;

a thermoelectric cooler means having hot and cold junctions, with one of the junctions thereof thermally connected to a predetermined area of said charge coupled device, and with the other junction thereof thermally connected to a predetermined area of the aforesaid elongated heat pipe;

a thermoelectric heater means having hot and cold junctions, with one of the junctions thereof thermally connected to a predetermined area of said charge coupled device, and with the other junction thereof thermally connected to a predetermined area of the aforesaid elongated heat pipe;

power supply means connected to the hot and cold junctions of said thermoelectric cooler and heater means in such manner as to effect the timely electrical energization thereof; and means thermally connected to a predetermined area of the aforesaid heat pipe for extracting heat therefrom.

21. The device of claim 20, wherein said substantially cup-shaped insulator is a plastic insulator.

22. The device of claim 20, wherein said one junction of said thermoelectric cooler means that is connected to a predetermined area of said charge coupled device is a cold junction, and the other junction thereof that is thermally connected to a predetermined area of the aforesaid elongated heat pipe is a hot junction.

23. The device of claim 20, wherein said one junction of said thermoelectric heater means that is connected to a predetermined area of said charge coupled device is a hot junction, and the other junction thereof that is thermally connected to a predetermined area of the aforesaid elongated heat pipe is a cold junction.

24. The device of claim 20, wherein said thermoelectric heater means comprises a predetermined plurality of thermoelectric heaters.

25. The device of claim 20, wherein said thermoelectric cooler means comprises a predetermined plurality of thermoelectric coolers.

26. The invention of claim 20, further characterized by potting means disposed within that portion of the space within the aforesaid substantially cup-shaped insulator not occupied by said thermoelectric cooler and heater means.

27. The invention of claim 20, further characterized by:

a first heat-conducting gasket means disposed in thermal contact between the cold junction of said thermoelectric cooler means and said predetermined area of said charge coupled device; and a second heat-conducting gasket means disposed in thermal contact between the hot junction of said thermoelectric heater means and said predetermined area of said charge coupled device.

* * * * *